US008759227B2

(12) United States Patent
Narishige et al.

(10) Patent No.: US 8,759,227 B2
(45) Date of Patent: Jun. 24, 2014

(54) METHOD FOR PROCESSING A TARGET OBJECT

(75) Inventors: Kazuki Narishige, Nirasaki (JP); Kazuo Shigeta, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 307 days.

(21) Appl. No.: 12/876,811

(22) Filed: Sep. 7, 2010

(65) Prior Publication Data
US 2011/0059616 A1 Mar. 10, 2011

Related U.S. Application Data

(60) Provisional application No. 61/252,188, filed on Oct. 16, 2009.

(30) Foreign Application Priority Data

Sep. 8, 2009 (JP) ................................. 2009-207490

(51) Int. Cl.
H01L 21/302 (2006.01)
H01L 21/461 (2006.01)
B44C 1/22 (2006.01)

(52) U.S. Cl.
USPC ........... 438/714; 438/706; 438/710; 438/711; 438/717; 438/719; 439/723; 439/724; 439/734; 439/736; 216/41; 216/47; 216/49; 216/58; 216/61; 216/67; 216/70; 216/71; 216/72; 216/74; 216/79

(58) Field of Classification Search
USPC ........... 216/13, 41, 47, 49, 58, 67, 61, 70, 71, 216/72, 74, 79; 438/706, 707, 710, 711, 438/714, 717, 719, 723, 724, 734, 736, 737
See application file for complete search history.

(56) References Cited

U.S. PATENT DOCUMENTS

| 7,268,080 | B2 * | 9/2007 | Schroeder ...................... 438/689 |
| 7,399,712 | B1 * | 7/2008 | Graff ............................. 438/725 |
| 7,682,480 | B2 * | 3/2010 | Kanarik et al. ........... 156/345.28 |
| 8,133,819 | B2 * | 3/2012 | Wang et al. ................... 438/725 |
| 8,138,096 | B2 * | 3/2012 | Yoshida ........................ 438/714 |
| 8,216,485 | B2 * | 7/2012 | Kon et al. ...................... 216/67 |
| 2003/0232504 | A1 * | 12/2003 | Eppler et al. ................... 438/709 |

(Continued)

FOREIGN PATENT DOCUMENTS

| CN | 1663030 A | 8/2005 |
| CN | 100440449 C | 12/2008 |

(Continued)

Primary Examiner — Nadine Norton
Assistant Examiner — Christopher Remavege
(74) Attorney, Agent, or Firm — Rothwell, Figg, Ernst & Manbeck, P.C.

(57) ABSTRACT

A method for processing a target object includes arranging a first electrode and a second electrode for supporting the target object in parallel to each other in a processing chamber and processing the target object supported by the second electrode by using a plasma of a processing gas supplied into the processing chamber, the plasma being generated between the first electrode and the second electrode by applying a high frequency power between the first electrode and the second electrode. The target object includes an organic film and a photoresist layer formed on the organic film. The processing gas contains $H_2$ gas, and the organic film is etched by a plasma containing $H_2$ by using the photoresist layer as a mask while applying a negative DC voltage to the first electrode.

12 Claims, 11 Drawing Sheets

(56) References Cited

U.S. PATENT DOCUMENTS

| | | |
|---|---|---|
| 2005/0103748 A1* | 5/2005 | Yamaguchi et al. ............ 216/67 |
| 2006/0037703 A1* | 2/2006 | Koshiishi et al. ........ 156/345.47 |
| 2007/0165355 A1* | 7/2007 | Sato et al. .................... 361/230 |
| 2008/0185364 A1 | 8/2008 | Kon et al. |
| 2009/0087996 A1* | 4/2009 | Chi et al. ...................... 438/710 |
| 2009/0242515 A1* | 10/2009 | Honda et al. ................... 216/67 |
| 2012/0031875 A1* | 2/2012 | Hosoya et al. .................. 216/24 |

FOREIGN PATENT DOCUMENTS

| | | |
|---|---|---|
| EP | 0 061 350 A1 | 9/1982 |
| JP | 57-157523 | 9/1982 |
| JP | 60-110124 | 6/1985 |
| JP | 2-40914 | 2/1990 |
| JP | 2-252233 | 10/1990 |
| JP | 4-23425 | 1/1992 |
| JP | 7-307328 | 11/1995 |
| JP | 10-261627 | 9/1998 |
| JP | 2000-12293 A | 1/2000 |
| JP | 2003-45821 A | 2/2003 |
| JP | 2006-270018 A | 10/2006 |
| JP | 2007-317889 A | 12/2007 |
| WO | WO 2004/003988 A1 | 1/2004 |

* cited by examiner

METHOD FOR PROCESSING A TARGET OBJECT

CROSS-REFERENCE TO RELATED APPLICATIONS

This application claims priority to Japanese Patent Application No. 2009-207490 filed on Sep. 8, 2009, and U.S. Provisional Application No. 61/252,188 filed on Oct. 16, 2009, the entire contents of which are incorporated herein by reference.

FIELD OF THE INVENTION

The present invention relates to a method for processing a target object.

BACKGROUND OF THE INVENTION

When an etching target layer is plasma-etched, a resist mask such as a photoresist or the like is used. Especially, a recent trend toward fine processing demands the use of an ArF photoresist or an $F_2$ photoresist which is suitable for forming an opening pattern of a size no greater than about 0.13 μm, i.e., a photoresist exposed to a laser beam of which an emission source is ArF gas or $F_2$ gas.

However, an ArF photoresist layer and an $F_2$ photoresist layer have a low plasma resistance, so that their surfaces become rough during etching. The surface roughening of the photoresist layer causes deformation of the shape of the opening as the etching progresses. As a result, it is difficult to form an etching hole or an etching groove having a desired shape.

As for a method for improving plasma resistance of a photoresist layer, there are known a method for irradiating UV rays, electron rays or ion beams onto a surface of the photoresist layer (see, e.g., Japanese Patent Application Publication Nos. S60-110124, H2-252233 and S57-157523(corresponding to European Patent No. 0061350)), a method for hardening a photoresist by heating (Japanese Patent Application Publication No. H4-23425), and a method for coating a thin hardened layer on a surface of a photoresist layer by applying heat or beam energy to an organic Si compound (Japanese Patent Application Publication No. H2-40914).

However, in the above-described methods for improving plasma resistance of a photoresist layer, it is required to perform a plasma resistance improvement process in a chamber different from an etching chamber for a subsequent etching process. The transfer of a target object from the chamber for performing the plasma resistance improvement process to the etching chamber leads to a decrease in a yield in the transfer process or a decrease in a throughput due to the transfer time. Further, when the chamber for performing the plasma resistance improvement process and the etching chamber are independently provided, an additional space is required and cost is increased.

Meanwhile, if an etching target layer is directly covered by a photoresist layer, a dimensional accuracy of an opening pattern decreases when the opening pattern is formed by exposing and developing the photoresist layer. To that end, an antireflection layer is inserted between the etching target layer and the photoresist mask layer. In Japanese Patent Application Publication No. H10-261627, the antireflection layer is etched by a plasma of a gas containing a compound of C and F, e.g., a gaseous mixture of $C_4F_8$ and $O_2$, a gaseous mixture of HBr, $CF_4$ and He, or a gaseous mixture of $CH_2F_2$, $CF_4$ and He. As for an etching gas for etching the antireflection layer, there is also known, e.g., a gaseous mixture of $CF_4$ and $O_2$ (Japanese Patent Application Publication No. H7-307328).

However, when the antireflection layer is etched by the plasma of the gaseous mixture of $C_4F_8$ and $O_2$ or that of $CF_4$ and $O_2$, the surface of the photoresist layer becomes rough, or elongated strips are formed on the photoresist layer. Or, the photoresist layer may not serve as a mask layer due to excessive etching.

Therefore, in PCT Publication No. WO2004/003988 and its corresponding U.S. Patent Application Publication No. 2005-0103748, there has been proposed a method for etching an antireflection layer while improving plasma resistance of a photoresist layer (see, especially, the third embodiment thereof).

In WO2004/003988, the antireflection layer is etched by a plasma of a processing gas containing $H_2$ gas, or a processing gas containing $H_2$ gas and Ar gas, supplied into the etching chamber that has been exhausted. As a result, the plasma resistance of the photoresist layer is improved.

Compared to a method in which a process for improving plasma resistance of a photoresist layer is not performed, the method described in WO2004/003988 in which the plasma resistance of the photoresist layer is improved can suppress reduction in a height of the photoresist layer during the etching of the antireflection film.

However, the problem in which the height of the photoresist layer decreases remains unsolved. In some cases, the height of the photoresist layer becomes insufficient for etching.

SUMMARY OF THE INVENTION

In view of the above, the present invention provides a method for processing a target object while suppressing reduction in a height of a photoresist layer.

In accordance with an aspect of the present invention, there is provided a method for processing a target object including: arranging a first electrode and a second electrode for supporting the target object in parallel to each other in a processing chamber, and processing the target object supported by the second electrode by using a plasma of a processing gas supplied into the processing chamber, the plasma being generated between the first electrode and the second electrode by applying a high frequency power between the first electrode and the second electrode.

Herein, the target object includes an organic film and a photoresist layer formed on the organic film, and the processing gas contains $H_2$ gas, and the organic film is etched by a plasma containing $H_2$ by using the photoresist layer as a mask while applying a negative DC voltage to the first electrode.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
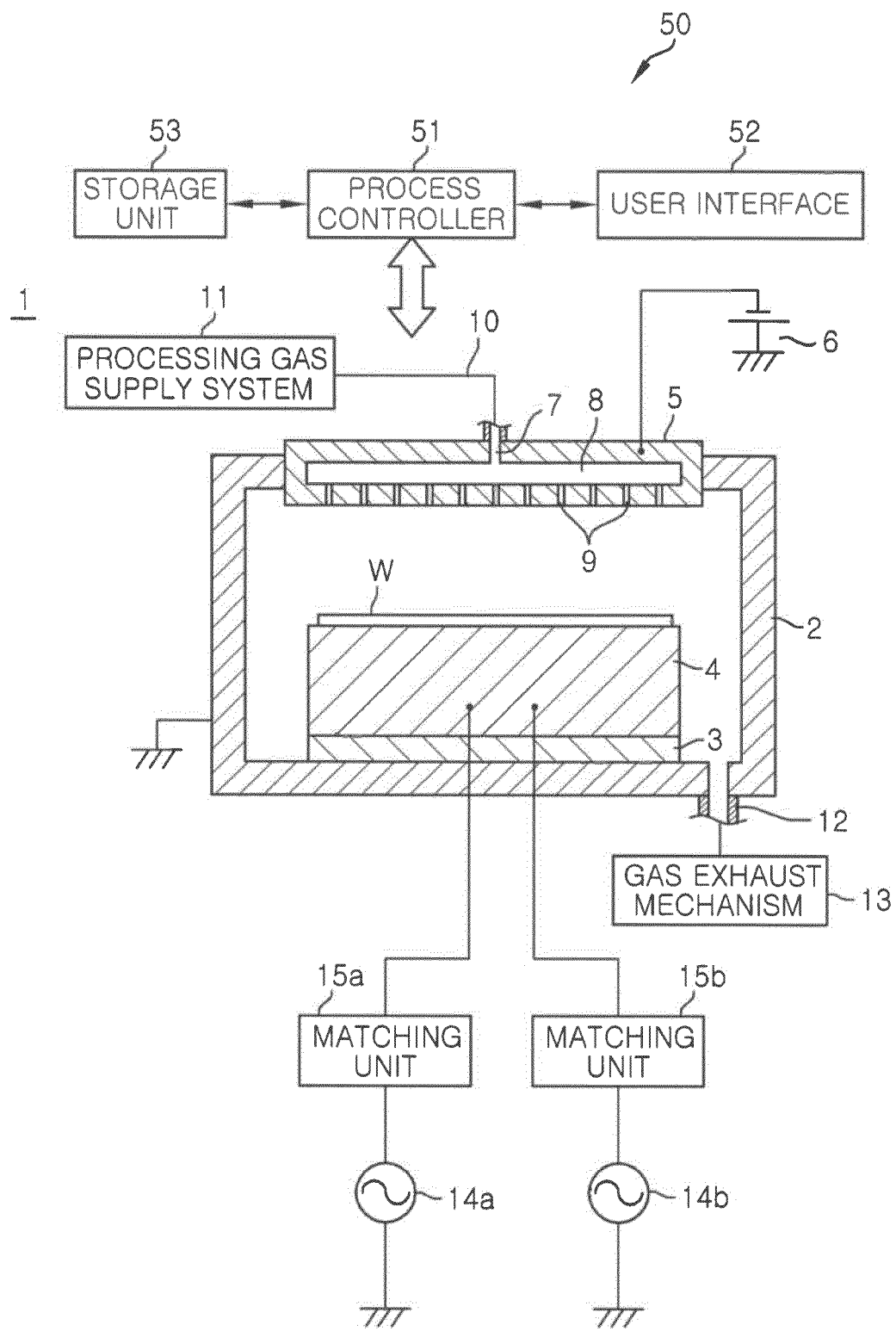
FIG. 1 is a cross sectional view schematically showing a processing apparatus capable of performing a method for processing a target object in accordance with a first embodiment of the present invention.

The embodiments of the present invention will be described with reference to the accompanying drawings which form a part hereof. Further, throughout the drawings, like reference numerals will be given to like parts.

First Embodiment

In FIG. 1, the processing apparatus is configured as, e.g., a capacitively coupled parallel plate type plasma etching apparatus for etching an organic film on a semiconductor wafer as a target object.

The plasma etching apparatus 1 has a substantially cylindrical airtight chamber 2 into which the wafer W is loaded.

A stage 4 which mounts thereon the wafer W and serves as a lower electrode is provided at a bottom portion of the chamber 2 via a dielectric plate 3 made of ceramic or the like. The stage 4 is made of a metal such as aluminum or the like, and has on a top surface thereof an electrostatic chuck (not shown) for electrostatically attracting the wafer W. Moreover, the stage 4 has therein a coolant flow path (not shown) through which a coolant medium flows to cool the wafer W.

A shower head 5 serving as an upper electrode is provided at an upper portion of the chamber 2 so as to face the stage 4. The shower head 5 serving as the upper electrode and the stage 4 serving as the lower electrode constitute parallel plate electrodes. The shower head 5 of this example contains silicon or silicon carbide on its surface facing the stage 4, and is connected to a negative (−) side of a DC power supply 6. The shower head 5 has a gas inlet port 7 at an upper portion thereof, a gas diffusion space 8 in an inner space thereof, and a plurality of gas injection openings 9 at a bottom portion thereof. One end of a gas supply line 10 is connected to the gas inlet port 7. A processing gas supply system 11 for supplying a processing gas for etching is connected to the other end of the gas supply line 10. The processing gas for etching is supplied from the processing gas supply system 11 into the chamber 2 through the gas supply line 10 and the shower head 5. In this example, $H_2$ gas and Ar gas are used as the processing gas for etching.

A gas exhaust line 12 is connected to the bottom portion of the chamber 2. A gas exhaust mechanism 13 including a vacuum pump, a pressure control valve and the like is connected to the gas exhaust line 12. The chamber 2 is exhausted by the gas exhaust mechanism 13 and maintained at a predetermined vacuum level.

In this example, two high frequency powers are supplied to the stage 4 serving as the lower electrode. One is a first high frequency power having a high frequency suitable for plasma generation, and the other is a second high frequency power having a frequency lower than that of the first high frequency power which is suitable for ion attraction. The first high frequency power has a frequency ranging from, e.g., about 10 MHz to about 100 MHz inclusive, and the second high frequency power has a frequency ranging from, e.g., about 0.1 MHz to about 15 MHz inclusive. In this example, the first high frequency power has a frequency of, e.g., about 40 MHz, and the second high frequency power has a frequency of, e.g., about 13 MHz. The first high frequency power is supplied from a first high frequency power supply 14a to the stage 4 via a matching unit 15a. The second high frequency power is supplied from a second high frequency power supply 14b to the stage 4 via a matching unit 15b. Although two high frequency powers are supplied to the stage 4 in the above example, a single high frequency power may be supplied to the stage 4.

The plasma etching apparatus 1 is controlled by a control unit 50. The control unit 50 includes a process controller 51, a user interface 52, and a storage unit 53. The process controller 51 has a micro processor (computer). The user interface 52 has a keyboard through which an operator inputs commands to manage the plasma etching apparatus 1, a display for visually displaying an operation status of the plasma etching apparatus 100, and the like. The storage unit 53 stores therein control programs to be used in realizing various processes performed by the plasma etching apparatus 1 under the control of the process controller 51, and various databases and recipes to be used in performing processes of the plasma etching apparatus 1 in accordance with processing conditions. The recipes are stored in a storage medium of the storage unit 53. The storage medium may be a computer readable device, e.g., a hard disk, or a portable storage medium such as a CD-ROM, a DVD, a flash memory or the like. Alternatively, the recipes may be appropriately transmitted from another device through, e.g., a dedicated line. A certain recipe is read out from the storage unit 53 in accordance with the command from the user interface 52 and executed in the process controller 51. Accordingly, the organic film formed on the wafer W is etched by the plasma etching apparatus 1 under the control of the process controller 51.

Hereinafter, a method for processing a target object in accordance with the first embodiment of the present invention will be described.

Figure 2:
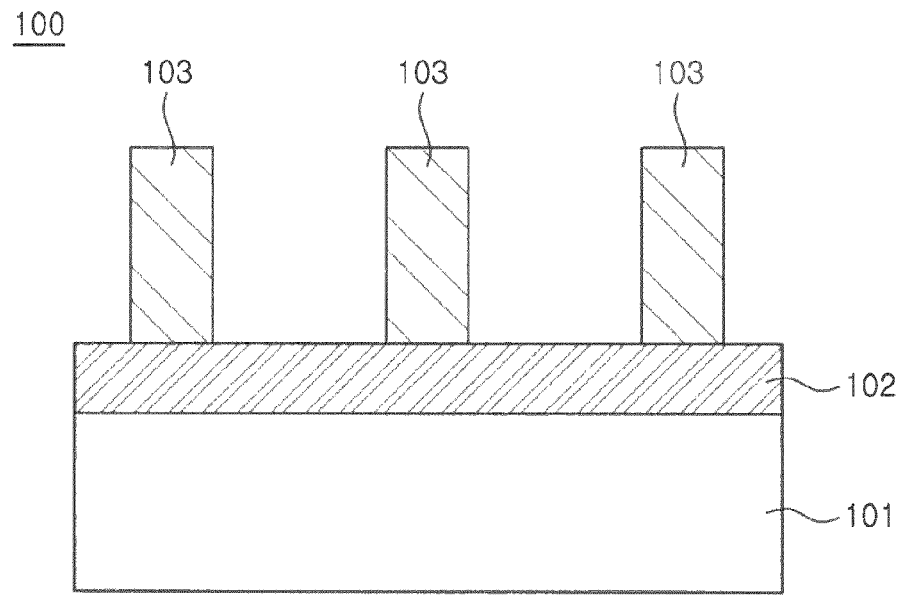
FIG. 2 presents a cross sectional view illustrating a sample used in the method for processing the target object of the first embodiment.
Figure 3:
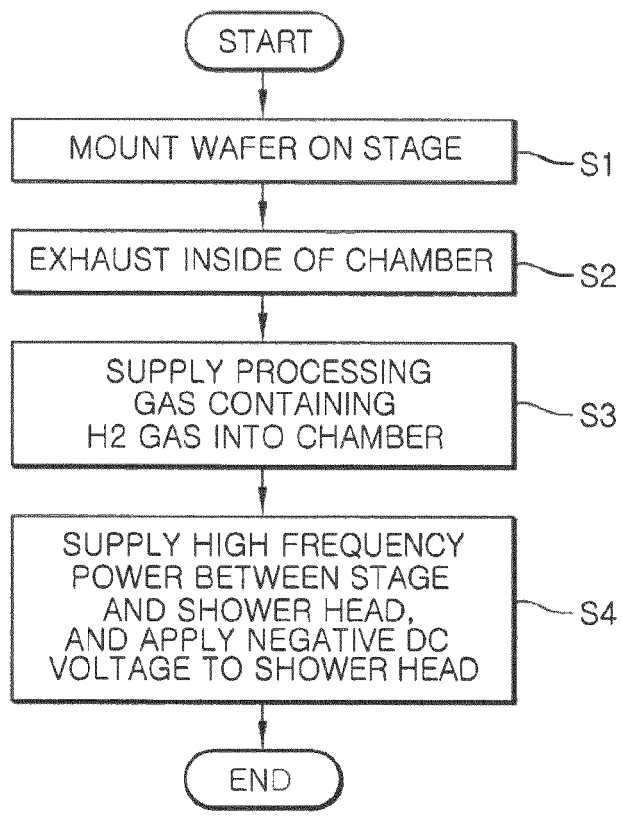
FIG. 3 represents a flowchart depicting the method for processing the target object of the first embodiment.

FIG. 2 provides a cross sectional view illustrating a sample used in the method for processing the target object in accordance with the first embodiment of the present invention; and FIG. 3 presents a flowchart depicting the processing method of the first embodiment.

As shown in FIG. 2, a sample 100 includes: a silicon-containing film 101 formed on a wafer (not shown); an organic film 102 formed on the silicon-containing film 101; and a photoresist layer 103 formed on the organic film 102. The organic film 102 is etched by using the photoresist layer 103 as a mask. In this embodiment, the silicon-containing film 101 is a silicon oxide film ($SiO_2$); the organic film 102 is a bottom anti-reflective coating (BARC) film; and the photoresist layer 103 is an ArF photoresist layer.

The sample 100, i.e., the wafer W, is processed in the following steps.

As shown in FIG. 3, the wafer W is first transferred into the chamber 2 and mounted on the stage 4 (step S1). Next, the chamber 2 is exhausted so that a pressure in the chamber 2 is reduced to a level lower than, e.g., about 100 mT (step S2). Then, $H_2$ gas and Ar gas for example are supplied as a processing gas containing $H_2$ gas into the chamber 2 (step S3). The flow rates of $H_2$ gas and Ar gas are, e.g., about 450 sccm and 450 sccm, respectively. After the processing gas is supplied, the pressure in the chamber 2 is increased to, e.g., about 100 mT.

Then, a first and a second high frequency power are supplied to the stage 4, so that the first and the second high frequency power are supplied between the stage 4 and the shower head 5, and a negative DC voltage is applied to the shower head 5 (step S4). The first high frequency power has a high frequency of, e.g., about 40 MHz, and the second high frequency power has a high frequency of, e.g., about 13 MHz. The first high frequency power is, e.g., about 500 W, and the second high frequency power is, e.g., about 0 W. Moreover, the negative DC voltage is, e.g., about −450 V. Under the above conditions, the organic film 102 is etched by using the photoresist layer 103 as a mask. The etching time is, e.g., about 25 seconds. This etching mechanism is shown in FIGS. 4A, 4B, 5A and 5B.

Figure 4A:
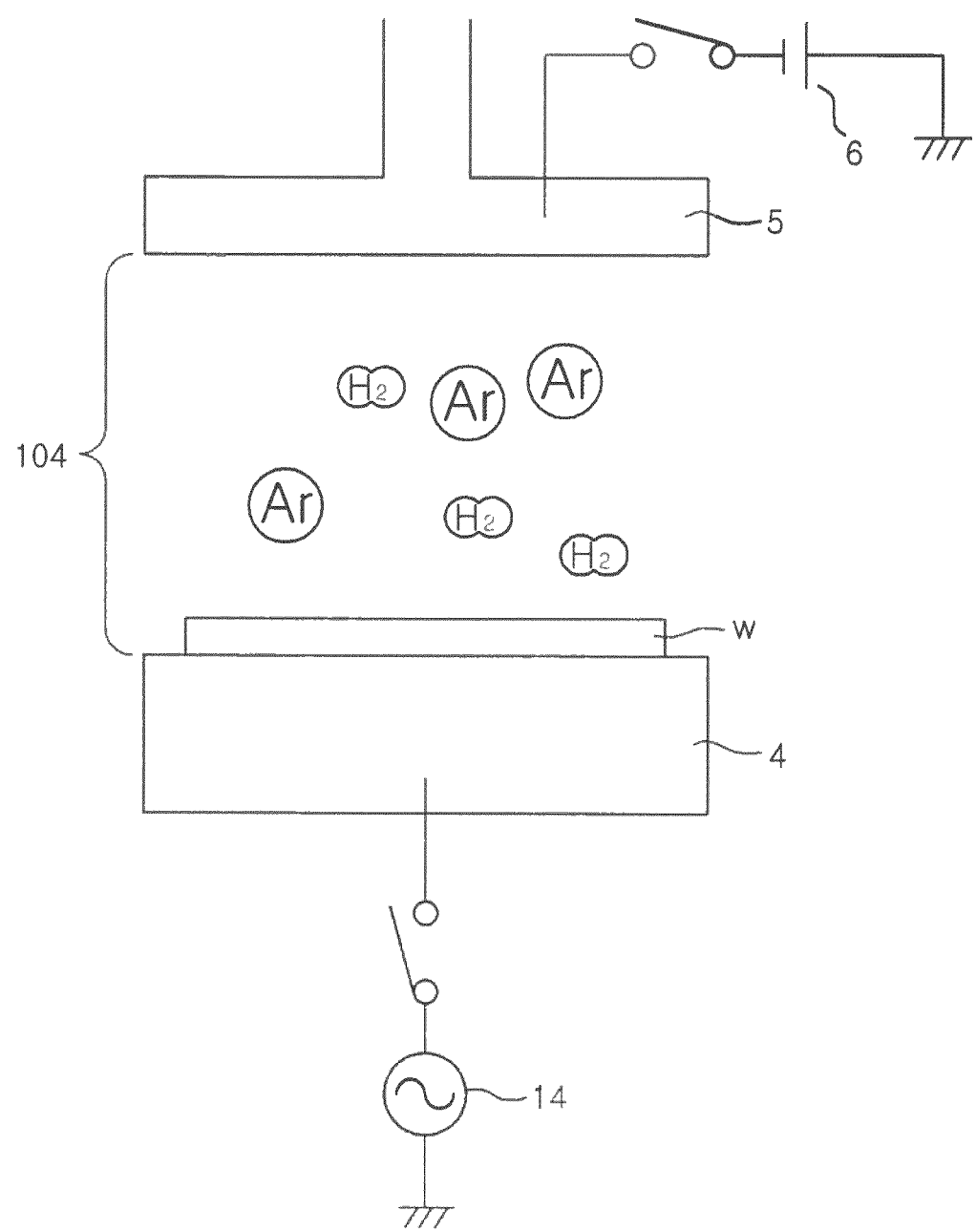
FIGS. 4A and 4B provide cross sectional views showing an etching mechanism in the first embodiment.

As shown in FIG. 4A, when the processing gas is supplied into the chamber 2, $H_2$ gas and Ar gas float in a processing space 104 defined between the stage 4 and the shower head 5.

Figure 4B:
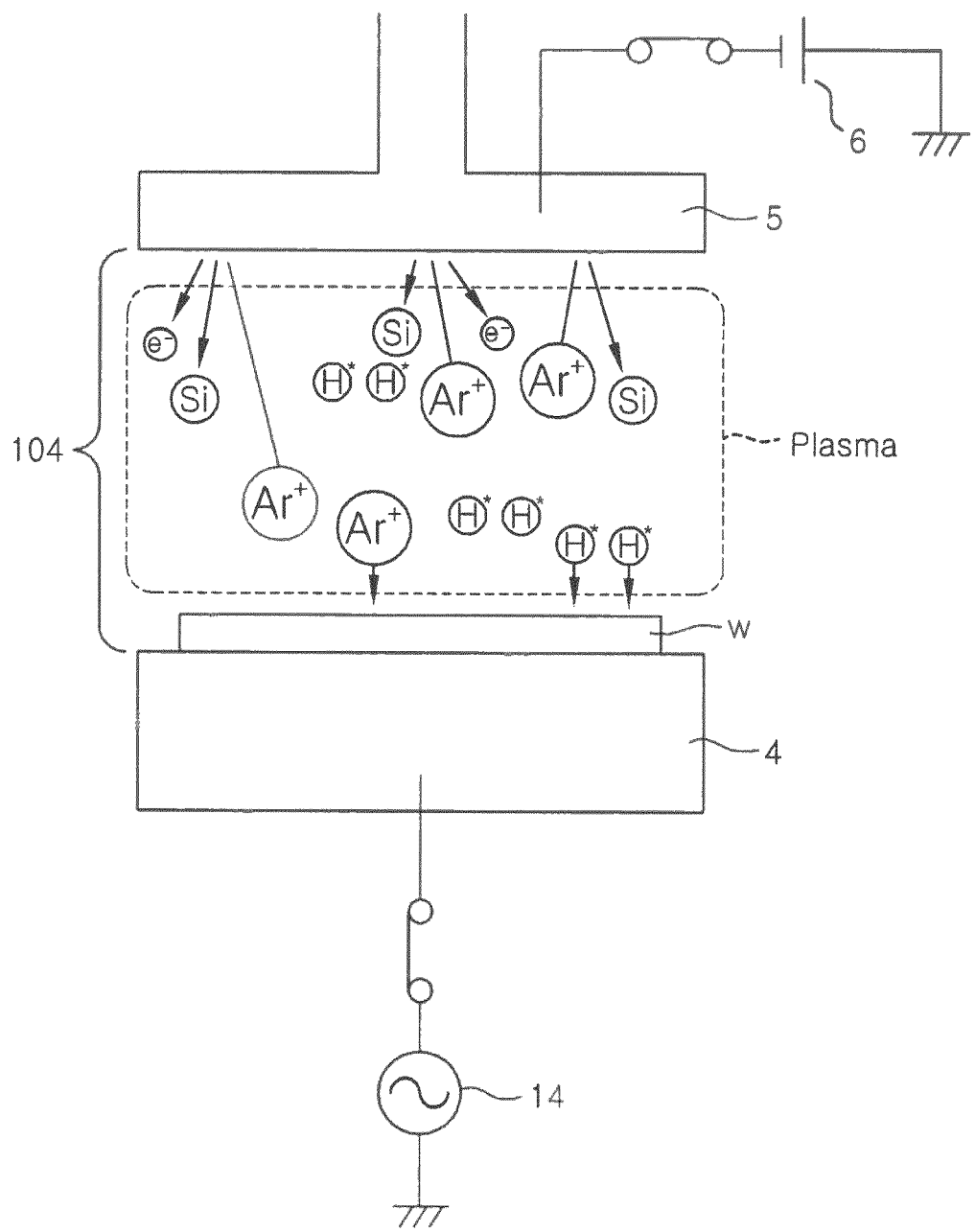

When a high frequency power is supplied between the stage 4 and the shower head 5 in that state, a plasma is generated. Further, $H_2$ gas floating in the processing space 104 loses $H_2$ molecules and is turned into hydrogen radicals (H*), and Ar gas is turned into Ar ions (Ar+), as illustrated in FIG. 4B. When a negative DC voltage is applied to the shower head 5 in that state, the Ar ions (Ar+) as positive charges move toward and collide with the shower head 5. Accordingly, silicon (Si) contained on the surface of the shower head 5 which faces the stage 4 is sputtered to the processing space 104. At the same time, electrons (e−) are emitted.

Figure 5A:
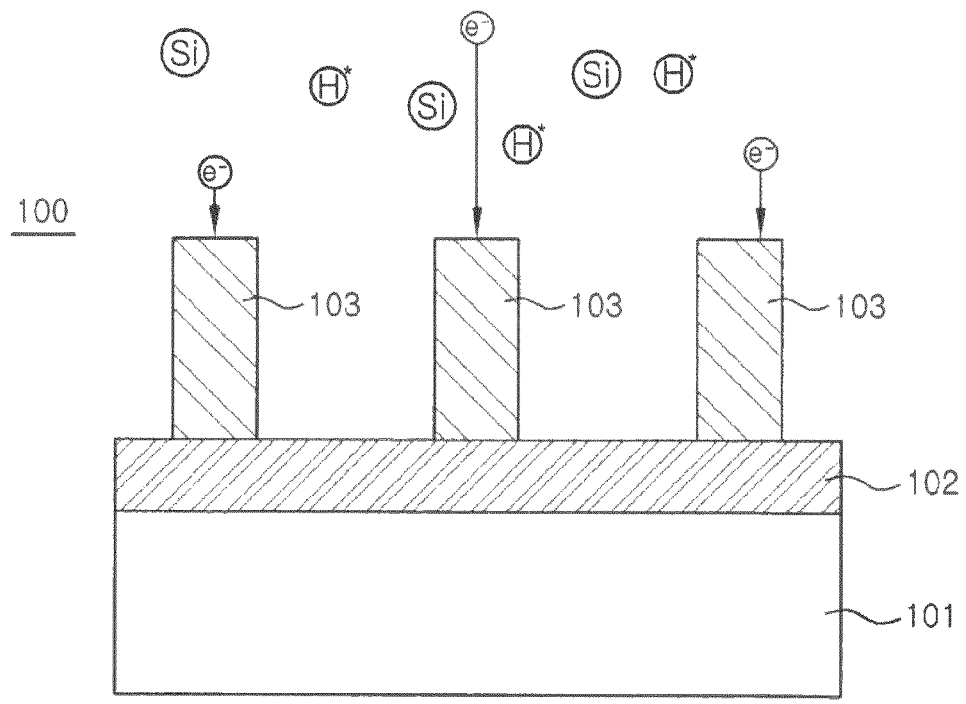
FIGS. 5A and 5B offer cross sectional views describing an etching mechanism in the first embodiment.
Figure 5B:
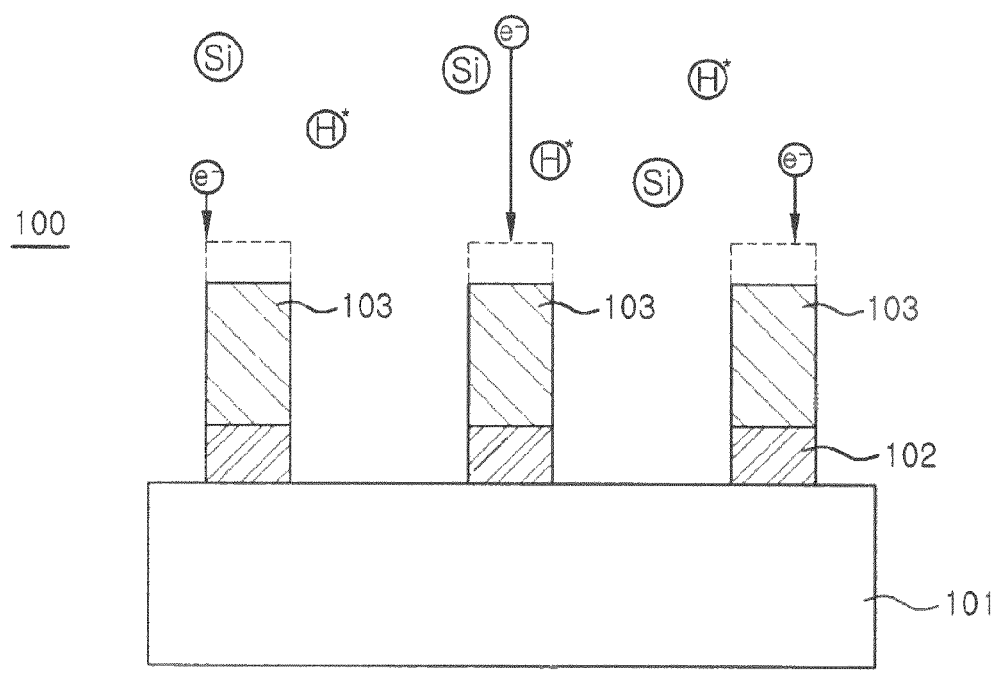

It is supposed that when the organic film 102 is etched by using the photoresist layer 103 as a mask in the above state, Si reacts with the photoresist layer 103 to form SiC on the surface of the photoresist layer 103, as shown in FIG. 5A. Further, the organic film 102 is etched while the photoresist layer 103 is reformed due to reaction such as cross-linking or the like caused by irradiation of electron rays onto the photoresist layer 103. Further, the organic film 102 is etched while the photoresist layer 103 is reformed due to reaction between hydrogen radicals (H*) and the photoresist layer 103. As a result, the organic film 102 can be etched while suppressing reduction in the height of the photoresist layer 103, as shown in FIG. 5B.

As such, in the method for processing the target object in accordance with the first embodiment of the present invention, it is supposed that when the organic film 102 is etched by using the photoresist layer 103 as a mask, SiC is formed on the photoresist layer 103 and the photoresist layer 103 is reformed by electron rays and hydrogen radicals. Hence, the processing method of the present embodiment can significantly suppress reduction in the height of the photoresist layer 103.

Figure 6A:
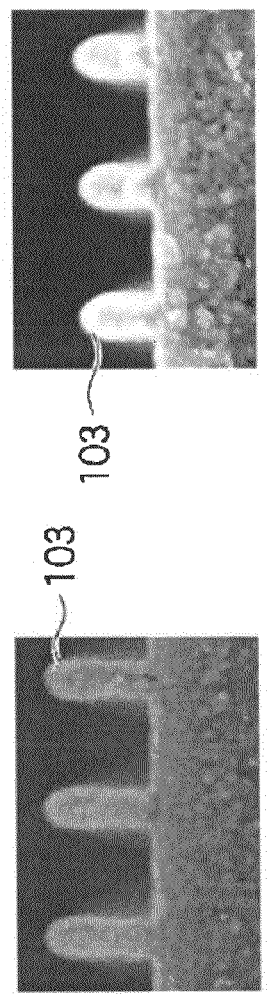
FIGS. 6A to 6C are photographs showing effects of the method for processing the target object of the first embodiment.
Figure 6B:
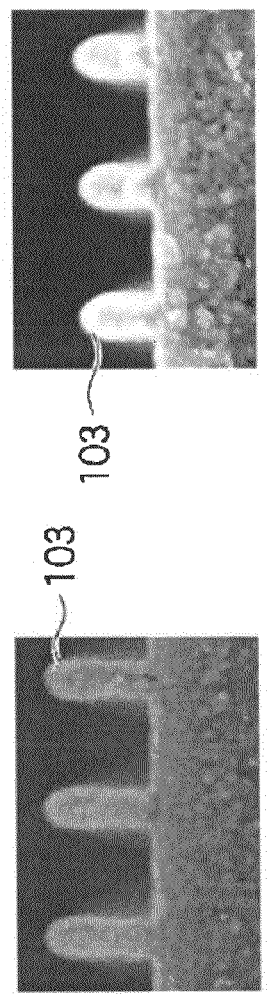
Figure 6C:
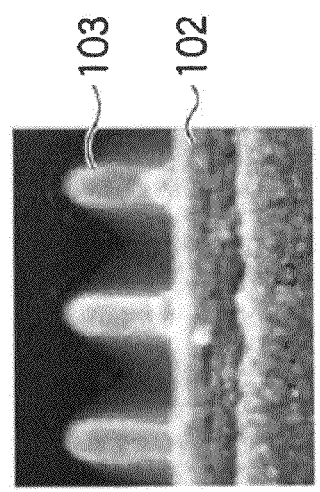

In order to check the effects of the method of the first embodiment, FIG. 6A shows an actual cross sectional image of the sample 100 which is taken before performing etching, and FIG. 6B shows an actual cross sectional image taken after performing etching in accordance with the method of the first embodiment. FIG. 6C illustrates, as a comparative example, an actual cross sectional image taken after performing etching in a state where the shower head 5 is grounded.

As shown in FIG. 6B, the method of the first embodiment can suppress the reduction in the height of the photoresist layer 103 during the etching of the organic film 102, compared to the comparative example shown in FIG. 6C. The etching conditions of the comparative example, such as a pressure, a processing gas, a flow rate of the processing gas and etching time, are the same as those of the method of the first embodiment except that the shower head 5 is grounded without applying a negative DC voltage thereto.

Figure 7A:
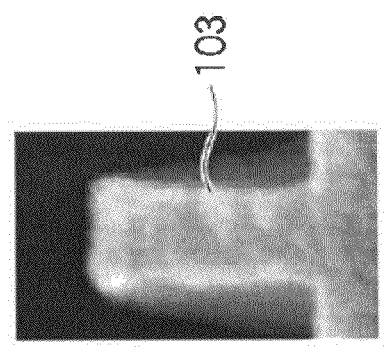
FIGS. 7A to 7C are photographs showing an example of hardening of a photoresist layer in the first embodiment.
Figure 7B:
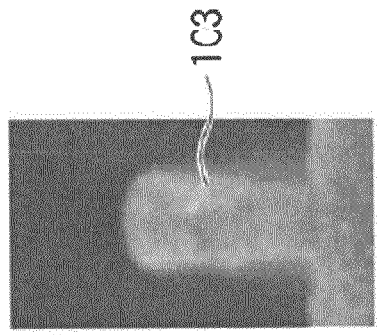
Figure 7C:
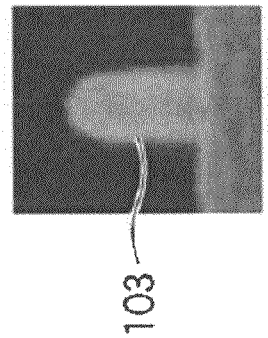

Further, in accordance with the first embodiment of the present invention, the photoresist layer 103 can be hardened. FIGS. 7A to 7C show an example of hardening of the photoresist layer 103. The test for checking effects of hardening of the photoresist 103 was performed in the following manner.

(Recipe 1)

Recipe 1 describes hardening conditions of the photoresist layer. The processing conditions were set as follows.
Pressure in the chamber: 100 mT
Processing gas: $H_2$ gas+Ar gas
Processing gas flow rate: $H_2$/Ar=450 sccm/450 sccm
High frequency power: 500 W (40 MHz)
Upper electrode DC voltage: −450 V
Processing time: 20 sec (Recipe 2)

Recipe 2 describes etching conditions of the photoresist layer. The processing conditions were set as follows.
Pressure in the chamber: 10 mT
Processing gas: CO gas+$O_2$ gas
Processing gas flow rate: CO/$O_2$=120 sccm/120 sccm
High frequency power: 100 W (40 MHz)
Upper electrode DC voltage: none
Processing time: 20 sec FIG. 7A shows an actual cross sectional image of a sample. The sample included a base film formed on a wafer (not shown) and a photoresist layer 103 formed on the base film. In this example, the base film was an SiON film, and the photoresist layer 103 was an ArF photoresist layer.

FIG. 7B depicts a cross sectional image taken after executing the recipes 1 and 2. When the photoresist layer 103 was hardened by the recipe 1 and then etched by the recipe 2, the photoresist layer 103 had a sufficient height even after about 20 seconds of the etching.

On the other hand, when the recipe 2 was executed without executing the recipe 1, the height of the photoresist layer 103 was decreased remarkably as shown in FIG. 7C, compared to that shown in FIG. 7B.

It is confirmed from the test that the photoresist layer 103 is hardened by executing the recipe 1 to improve $O_2$ plasma resistance thereof.

Second Embodiment

FIGS. 8A to 8D provide cross sectional views showing a method for processing a target object in accordance with a second embodiment of the present invention.

As described in the first embodiment, the photoresist layer 103 is hardened, and it is easy to trim (slim).

Figure 8A:
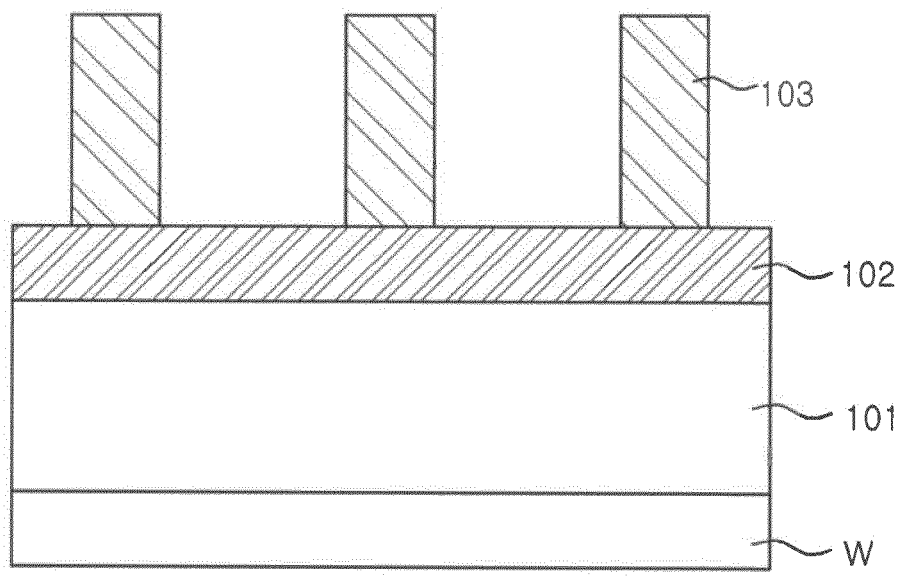
FIGS. 8A to 8D set forth cross sectional views describing a method for processing a target object in accordance with a second embodiment of the present invention.

As illustrated in FIG. 8A, the silicon-containing film 101 is formed on the wafer W; the organic film 102 is formed on the silicon-containing film 101; and the photoresist layer 103 is formed on the organic film 102.

Figure 8B:
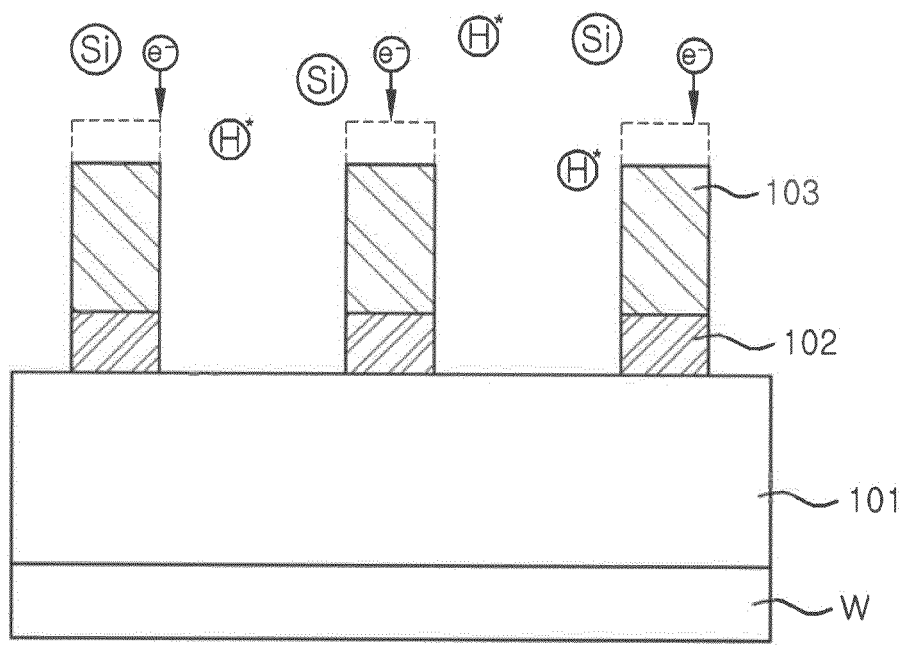

Next, as shown in FIG. 8B, the organic film 102 is etched by the processing method described in the first embodiment.

Figure 8C:
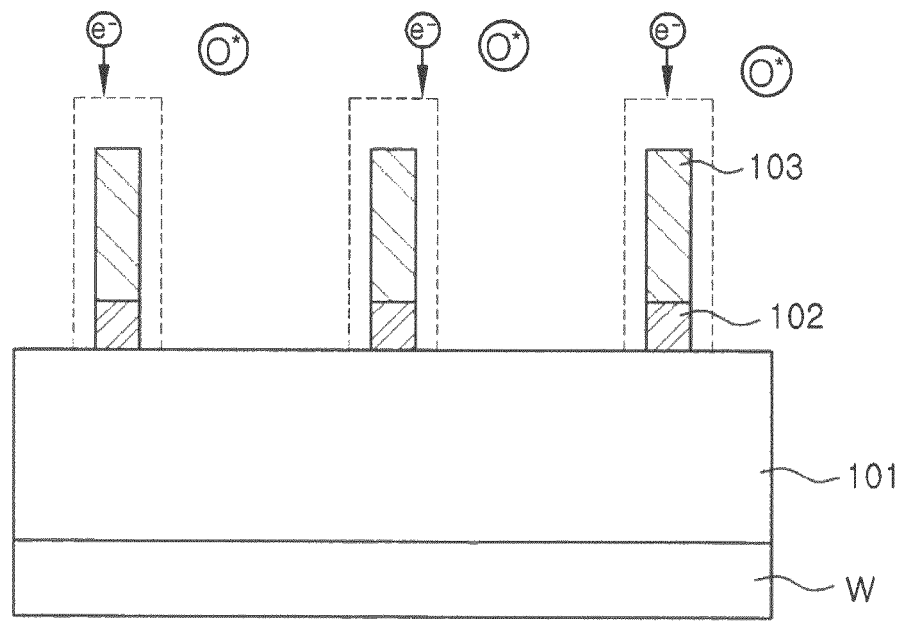

Then, as illustrated in FIG. 8C, a plasma of a processing gas containing $O_2$ is generated by applying a high frequency power between the stage 4 and the shower head 5 (e.g., see FIG. 1). The organic film 102 and the photoresist layer 103 are etched by $O_2$ radicals (O*) in the plasma of the $O_2$-containing gas and reduced in size.

Figure 8D:
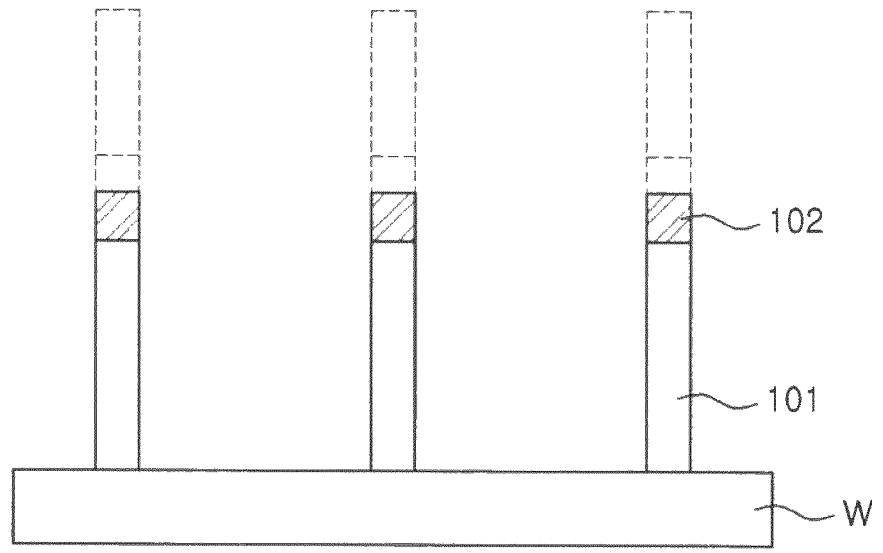

Then, as shown in FIG. 8D, the silicon-containing film 101 is etched by using as a mask the organic film 102 and the photoresist layer 103 that have been slimmed. As a consequence, a pattern is formed by the silicon-containing film 101 having a size smaller than, e.g., a minimum exposure size.

As such, in the method for processing the target object in accordance with the above embodiments of the present invention, the photoresist layer 103 is hardened to improve the plasma resistance thereof. Hence, the organic film 102 and the photoresist layer 103 can be trimmed at the same time. For that reason, the method for processing the target object in accordance with the above embodiments is advantageous in forming a silicon-containing film 101 having, e.g., a size smaller than the minimum exposure size.

Under conventional processing conditions to which the present invention is not applied, a trimming process causes removal of the organic film 102 and the photoresist layer 103 or pattern collapse thereof, so that the organic film 102 and the photoresist layer 103 cannot be trimmed.

Third Embodiment

As described in the method for processing the target object in accordance with the second embodiment of the present invention, the photoresist layer 103 can be hardened during the etching of the organic film 102.

The photoresist layer 103 can be hardened more firmly by additionally performing a process for hardening the photoresist layer 103 which will be described below as a third embodiment.

Figure 9:
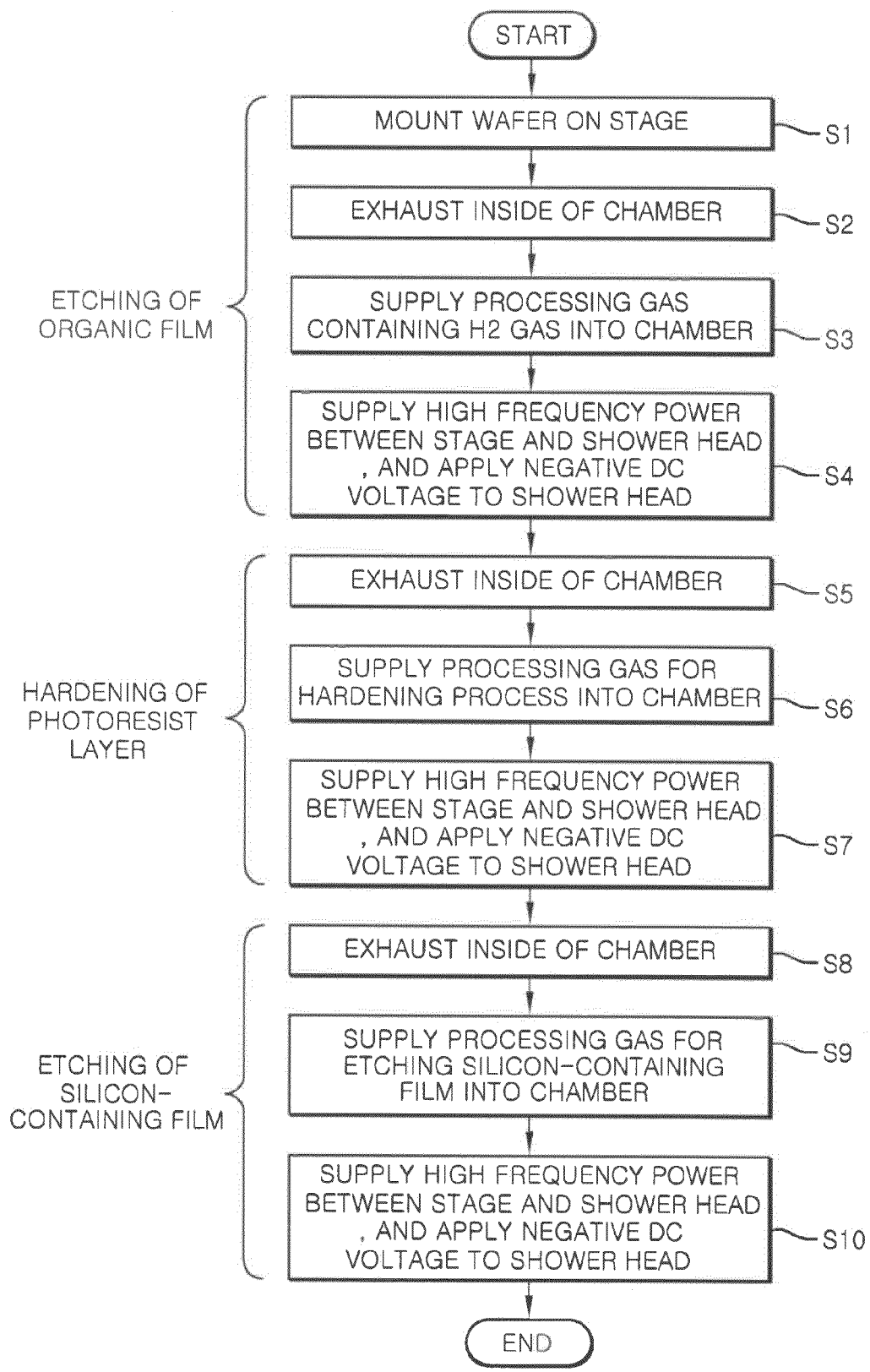
FIG. 9 presents a flowchart depicting a method for processing a target object in accordance with a third embodiment of the present invention.

FIG. 9 is a flowchart showing a method for processing a target object in accordance with the third embodiment of the present invention.

As shown in FIG. 9, the organic film 102 is etched by using the photoresist layer 103 as a mask by performing the steps S1 to S4 shown in FIG. 3. In this embodiment, the etching conditions of the organic film 102, such as a processing gas for etching the organic film, a flow rate of the processing gas and a pressure in the chamber 2, are the same as those in the steps S3 and S4 shown in FIG. 3 except that a negative DC voltage is set to about −250 V in the step S4 and etching time is set to about 20 seconds.

Next, the chamber 2 is exhausted so that a pressure in the chamber 2 is reduced to a level lower than, e.g., about 50 mT (step S5). Thereafter, $H_2$ gas, $CF_4$ gas and Ar gas for example are supplied as a processing gas containing $H_2$ gas into the chamber 2 to perform a hardening process (step S6). The flow rates of $H_2$ gas, $CF_4$ gas and Ar gas are, e.g., about 100 sccm, 40 sccm and 800 sccm, respectively. After the processing gas is supplied, the pressure in the chamber 2 is increased to, e.g., about 50 mT.

Then, a first and a second high frequency power are supplied to the stage 4, so that the first and the second high frequency power are supplied between the stage 4 and the shower head 5, and a negative DC voltage is applied to the shower head 5 (step S7). The first high frequency power has a high frequency of, e.g., about 40 MHz, and the second high frequency power has a high frequency of, e.g., about 13 MHz. The first high frequency power is, e.g., about 300 W, and the second high frequency power is, e.g., about 0 W. Moreover, the negative DC power is, e.g., about −900 V. Under the above conditions, the photoresist layer 103 is hardened. The processing time is, e.g., about 30 seconds.

Next, the chamber 2 is exhausted so that a pressure in the chamber 2 is reduced to a level lower than, e.g., about 30 mT (step S8). Thereafter, $CF_4$ gas, $CHF_3$ gas and Ar gas for example are supplied as a processing gas for etching a silicon-containing film into the chamber 2 (step S9). The flow rates of $CF_4$ gas, $CHF_3$ gas and Ar gas are, e.g., about 125 sccm, 20 sccm and 900 sccm, respectively. After the processing gas is supplied, the pressure in the chamber 2 is increased to, e.g., about 30 mT.

Next, a first and a second high frequency power are supplied to the stage 4, so that the first and the second high frequency power are supplied between the stage 4 and the shower head 5, and a negative DC voltage is applied to the shower head 5 (step S10). The first high frequency power has a high frequency of, e.g., about 40 MHz, and the second high frequency power has a high frequency of, e.g., about 13 MHz. The first high frequency power is, e.g., about 0 W, and the second high frequency is, e.g., about 800 W. Moreover, the negative DC voltage is, e.g., about −300 V. Under the above conditions, the silicon-containing film 101, e.g., silicon oxide film ($SiO_2$), is etched. The processing time is, e.g., about 45 seconds.

Figure 10A:
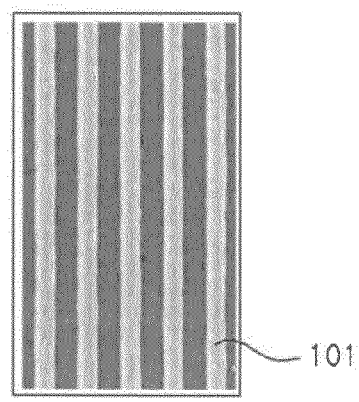
FIGS. 10A to 10C are photographs showing effects of the method for processing the target object of the third embodiment.

FIG. 10A presents a top view taken after the silicon-containing film 101 is actually etched in accordance with the processes shown in FIG. 9.

As shown in FIG. 10A, by etching the silicon-containing film 101 in accordance with the processes shown in FIG. 9, a uniform pattern of the silicon-containing film 101 having a line edge roughness (LER) of about 2.8 nm was formed.

Figure 10B:
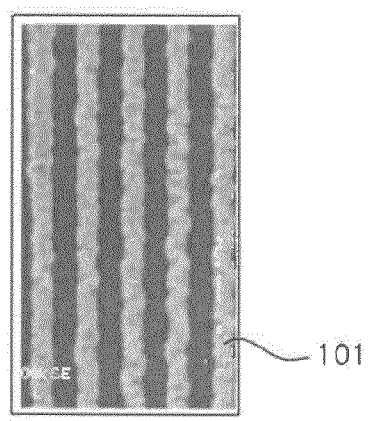

FIG. 10B shows, as a comparative example 1, a top view taken after etching the organic film 102 under conventional organic film etching conditions and then etching the silicon-containing film 101. The conventional organic film etching conditions are as follows.

Pressure in the chamber: 30 mT
Processing gas for etching the organic film: $CF_4$ gas/$O_2$ gas
Processing gas flow rate: $CF_4/O_2$=250 sccm/5 sccm
High frequency power: 400 W (40 MHz)
Upper electrode DC voltage: none
Processing time: 18 sec Further, the etching conditions of the silicon-containing film are the same as those in the third embodiment.

In that case, the LER was about 8.7 nm.

Figure 10C:
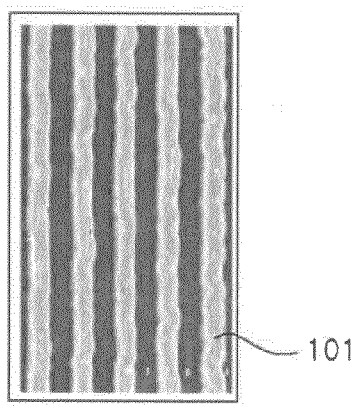

Moreover, FIG. 10C depicts, as a comparative example 2, a top view taken after etching the organic film, performing a hardening process in accordance with the third embodiment, and then etching the silicon-containing film.

In the comparative example 2, the etching conditions of the organic film are the same as those in the comparative example 1, and the hardening conditions and the etching conditions of the silicon-containing film are the same as those in the third embodiment.

In that case, the LER was improved to about 6.4 nm.

As such, in accordance with the third embodiment, the LER can be improved by etching the organic film by using a plasma of a gas containing $H_2$ and Ar while applying a negative DC voltage to the shower head 5 and then hardening the photoresist layer 103 by using a plasma of a gas containing $H_2$, C, F and Ar while applying a negative DC voltage to the shower head 5.

In addition, as depicted in the top view of FIG. 10A, the third embodiment can reduce wiggling (undulation of pattern) compared to the comparative example 1 (FIG. 10B) and the comparative example 2 (FIG. 10C).

As such, in accordance with the third embodiment, it is possible to obtain a method for processing a target object which can improve LER and reduce wiggling.

In accordance with the embodiments of the present invention, it is possible to provide a method for processing a target object while suppressing reduction in a height of a photoresist layer.

While the invention has been shown and described with respect to the embodiments, it will be understood by those skilled in the art that various changes and modifications may be made without departing from the scope of the invention as defined in the following claims.

For example, although the silicon-containing film 101 is an $SiO_2$ film in the above-described embodiments, the silicon-containing film is not limited to an $SiO_2$ film and may be another film containing silicon such as an Si film, an SiN film, an SiON film, an SiOC film or the like.

What is claimed is:

1. A method of processing a target object in a processing chamber having therein a first electrode and a second electrode disposed in parallel to each other, the target object including an etching target layer, an organic film formed on the etching target layer, and a patterned photoresist layer formed on the organic film, the method comprising the sequential steps of:
   placing the target object on the second electrode;
   etching the organic film by a plasma of a first processing gas containing $H_2$ by using the photoresist layer as a mask while applying a first negative DC voltage to the first electrode to harden the photoresist layer while etching the organic film;
   hardening the photoresist layer by using a plasma of a second processing gas containing $H_2$, C, F and Ar while applying a second negative DC voltage to the first electrode, wherein the second negative DC voltage is greater in magnitude than the first negative DC voltage; and
   etching the etching target layer by using the photoresist layer as a mask.

2. The method of claim 1, wherein the first electrode is made of a material containing silicon and sputtered by the first negative DC voltage applied thereto while etching the organic film, so that the photoresist layer is hardened by the sputtered silicon, hydrogen and electrons.

3. The method of claim 2, wherein the first processing gas further contains Ar gas.

4. The method of claim 1, wherein the etching target layer includes a silicon-containing film.

5. The method of claim 2, wherein the etching target layer includes a silicon-containing film.

6. The method of claim 3, wherein the etching target layer includes a silicon-containing film.

7. A method of processing a target object including an etching target layer, an organic film formed on the etching target layer, and a patterned photoresist layer formed on the organic film, the method comprising:
   a first step of etching the organic film by a plasma of a first processing gas containing $H_2$ by using the patterned photoresist layer as a mask while the photoresist layer is hardened;
   a second step of further hardening the photoresist layer hardened in the first step by using a plasma of a second processing gas containing $H_2$, C, F, and Ar; and
   a third step of etching the etching target layer by using the photoresist layer that was further hardened in the second step as a mask,
   wherein the first, the second, and the third step are successively performed within a single processing chamber having therein a first electrode and a second electrode disposed in parallel to each other, and
   wherein, in the first step, a first negative DC voltage is applied to the first electrode to harden the photoresist layer, and, in the second step, a second negative DC voltage is applied to the first electrode for said further hardening.

8. The method of claim 7, wherein the first electrode is made of a material containing silicon and sputtered by the first negative DC voltage applied thereto while etching the organic film, so that the photoresist layer is hardened by the sputtered silicon, hydrogen, and electrons.

9. The method of claim 8, wherein the first processing gas further contains Ar gas.

10. The method of claim 7, wherein the etching target layer includes a silicon-containing film.

11. The method of claim 8, wherein the etching target layer includes a silicon-containing film.

12. The method of claim 9, wherein the etching target layer includes a silicon-containing film.

* * * * *